(12) United States Patent
Dattalo et al.

(10) Patent No.: US 7,735,383 B2
(45) Date of Patent: Jun. 15, 2010

(54) BALANCED RESISTANCE CAPACITIVE SENSING APPARATUS

(75) Inventors: Tracy Scott Dattalo, Santa Clara, CA (US); Bob Lee Mackey, San Jose, CA (US); Calvin Wang, Santa Clara, CA (US); John J. Brady, Santa Clara, CA (US)

(73) Assignee: Synaptics Incorporated, Santa Clara, CA (US)

( * ) Notice: Subject to any disclaimer, the term of this patent is extended or adjusted under 35 U.S.C. 154(b) by 98 days.

(21) Appl. No.: 12/144,928

(22) Filed: Jun. 24, 2008

(65) Prior Publication Data

US 2009/0314105 A1 Dec. 24, 2009

(51) Int. Cl.
*G01L 1/12* (2006.01)
(52) U.S. Cl. .................... 73/862.626; 73/780
(58) Field of Classification Search .............................
73/862.621–862.629, 780
See application file for complete search history.

(56) References Cited

U.S. PATENT DOCUMENTS

| 6,642,857 | B1 * | 11/2003 | Schediwy et al. ............. 341/20 |
| 6,844,714 | B2 * | 1/2005 | Balmain et al. ............... 324/72 |
| 7,295,724 | B2 * | 11/2007 | Wang et al. .................... 385/13 |
| 2003/0056589 | A1 * | 3/2003 | Geen et al. ............... 73/504.14 |
| 2008/0252608 | A1 | 10/2008 | Geaghan |

* cited by examiner

*Primary Examiner*—Max Noori

(57) ABSTRACT

Embodiments for a capacitive sensing apparatus with attenuated electrical interference across a plurality of routing traces are provided. One embodiment forms a first sensor electrode on a substrate. In addition, a first routing trace is formed on the substrate, the first routing trace coupled with the first sensor electrode. One embodiment additionally forms a second sensor electrode on the substrate. A second routing trace differing in length from the first routing trace is also formed on the substrate, the second routing trace coupled with the second sensor electrode. To attenuate electrical interference, the second routing trace is formed having an approximately equal RC time constant characteristic as the first routing trace.

20 Claims, 3 Drawing Sheets

BALANCED RESISTANCE CAPACITIVE SENSING APPARATUS

BACKGROUND

Capacitive sensing devices, otherwise known as touch sensing devices or proximity sensors are widely used in modern electronic devices/apparatus. A capacitive sensing device is often used for touch based navigation, selection, or other input, in response to a finger, stylus, or other object being placed on or in proximity to a sensor of the capacitive sensing device. In such a capacity, capacitive sensing devices are often employed in computers (e.g. notebook/laptop computers), touch screens, media players, multi-media devices, remote controls, personal digital assistants, smart devices, telephones, control consoles, and the like. Un-patterned sheet sensors (both capacitive and resistive) are often employed as a simple and economical method means for implementing attractive sensors for sensing contact, touch, and/or proximity based inputs.

However, there exist many limitations to the current state of technology with respect to capacitive sensing devices. For example, during operation a capacitive sensing device may become distorted due to the presence of noise. That is, interference sources such as LCD's and RF transmitters can corrupt signals produced by capacitive sensors within the capacitive sensing device.

SUMMARY

Embodiments for a capacitive sensing apparatus with attenuated electrical interference across a plurality of routing traces are provided. One embodiment forms a first sensor electrode on a substrate. In addition, a first set of routing traces is formed on the substrate, the first routing trace coupled with the first sensor electrode. One embodiment additionally forms a second sensor electrode on the substrate. A second set of routing traces differing in length from the first routing trace is also formed on the substrate, the second routing trace coupled with the second sensor electrode. To attenuate electrical interference, the second routing trace is formed having an approximately equal RC time constant characteristic as the first routing trace.

BRIEF DESCRIPTION OF THE DRAWINGS

The accompanying drawings, which are incorporated in and form a part of this specification, illustrate example embodiments of the subject matter described herein and, together with the description, serve to explain principles discussed below.

Figure 1:
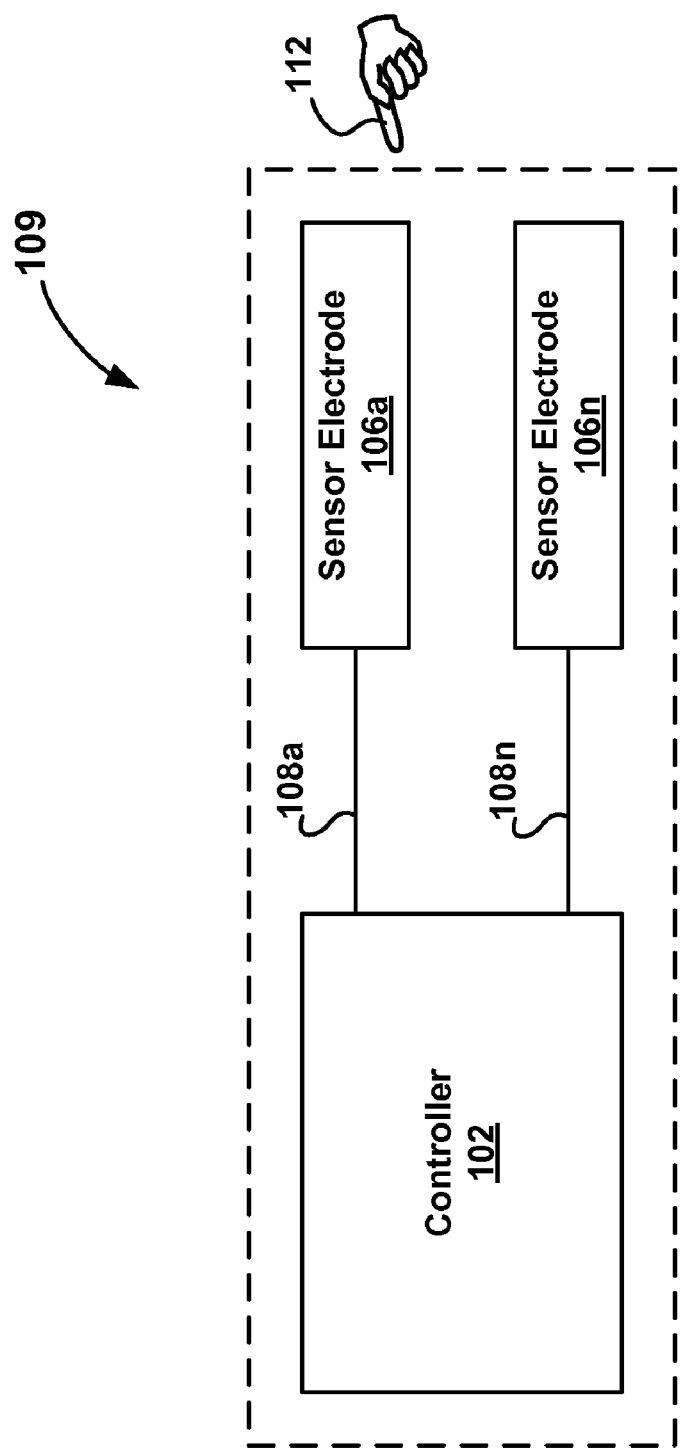
FIG. 1 is block diagram of a sensor device according to an embodiment of the present technology.

The drawings referred to below and in the detailed description should not be understood as being drawn to scale unless specifically noted.

DETAILED DESCRIPTION

Reference will now be made in detail to embodiments of the presented technology, examples of which are illustrated in the accompanying drawings. While the presented technology will be described in conjunction with embodiments, it will be understood that the descriptions are not intended to limit the presented technology to these embodiments. On the contrary, the descriptions are intended to cover alternatives, modifications and equivalents, which may be included within the spirit and scope as defined by the appended claims. Furthermore, in the following detailed description, numerous specific details are set forth in order to provide a thorough understanding of the presented technology. However, the presented technology may, in some embodiments, be practiced without these specific details. In other instances, well known methods, procedures, components, and circuits have not been described in detail as not to unnecessarily obscure aspects of the presented technology.

Overview of Discussion

In various embodiments, apparatus and techniques for balancing the RC time constants among the sensing channels in a capacitive sensing apparatus is described. In one embodiment, the balancing is a result of adding resistance in a controlled manner across one or more of the sensing channels (or routing traces) in a sensor device.

In one embodiment, a first material and a second material having a resistivity different from a resistivity of the first material is provided in series when forming each of the plurality of routing traces. By incorporating materials with different resistivity into each of the plurality of routing traces, the resultant impedance mismatch will allow each of the routing traces to act as a radio frequency (RF) reflector. Further, the impedance mismatch will reduce routing trace antenna efficiencies thereby resulting in reduced interference properties. For example, small resistivity changes in the routing trace will significantly reduce the RF coupling efficiency. In other words, the impedance mismatch will deter the routing trace from acting as an antenna when RF or other low frequency interference is encountered; such as when a sensor device is used in mobile phone applications, LCD applications, or the like.

In a further embodiment, the resistance of the routing traces may be varied per routing trace to provide an approximate RC time constant that is similar for each routing trace. In other words, by balancing the RC time constant across two or more routing traces common mode interference will be received at the controller as common mode noise and will result in a capacitive sensing device with significantly better balanced common mode RF interference recognition and removal.

Thus, when a sensing frequency is varied each routing trace will be affected similarly; that is, in a common mode fashion. As such, embodiments described herein provide a cost effective method of adding this resistance to a routing trace. Moreover, since the sensor device controller firmware is presently designed to cope with common mode disturbances, the technology described herein will enable variable sensing frequencies, reduce clock modulation related jitter, and the like while adding little or no present or follow-on programming overhead. Additionally, embodiments described herein may also be utilized for RC sheet sensors.

With reference now to FIG. 1, a sensor device 109 is shown. In one embodiment, sensor device 109 is implemented in an application specific integrated circuit (ASIC) that is specifically designed and configured to operate in conjunction with sensor electrodes of the capacitive touch sensing device.

In one embodiment, sensor device 109 includes a controller 102 coupled to sensor electrode 106a and sensor electrode 106n via trace 108a and trace 108n, respectively. Although two sensor electrodes are shown in FIG. 1, embodiments are well suited for use with a capacitive touch sensing device comprised of a single sensor electrode, two sensor electrodes, or more than two sensor electrodes. Additionally, embodiments in accordance with the present invention are well suited to use sensor electrodes having any of various shapes, sizes, or patterns.

FIG. 1 also includes an object 112 (e.g. a finger, a stylus, a pointing object, etc.) shown approaching sensor electrodes 106a and 106n. In general, as object 112 moves towards or away from sensor device 109, a change in a measured capacitance value will be observed.

Figure 2:
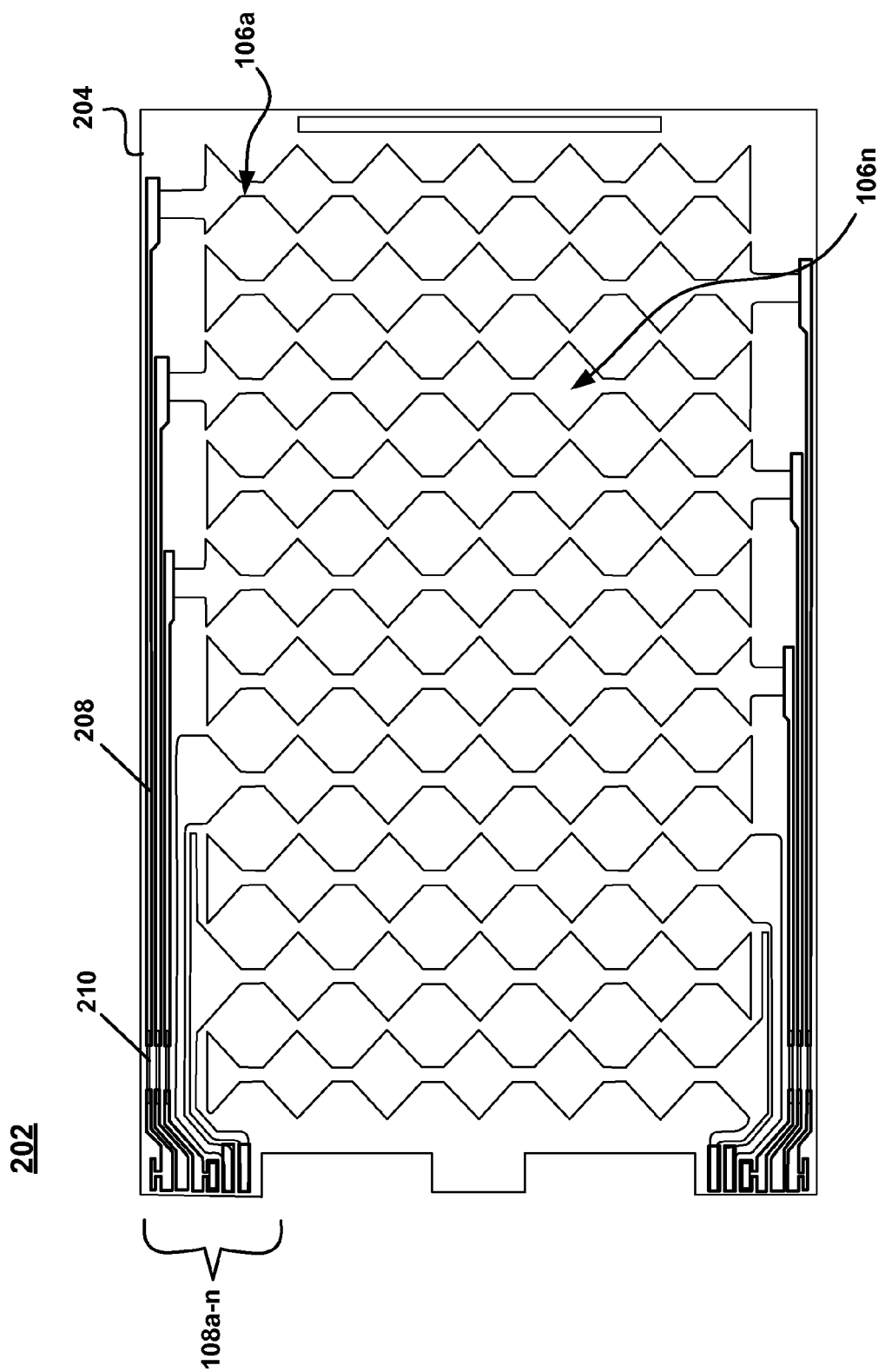
FIG. 2 is a top view of a sensor and routing trace array according to an embodiment of the present technology.

With reference now to FIG. 2, a sensor device 202 is shown in accordance with an embodiment of the technology. In general, FIG. 2 includes a substrate 204 having a plurality of traces 108a-108n formed thereon. In one embodiment, sensor electrodes 106a-106n and routing traces 108a-108n form the sensing area of sensor device 202. Furthermore, routing traces 108a-108n are each coupled to controller 102, of FIG. 1, to enable the operation of sensor device 109. It is noted that sensor device 109 may be placed over an information display device such as a liquid crystal display (LCD) or over an RF radiating device such as a mobile phone. As such, a user would view the underlying image or information display by looking through sensing area of sensor array 202. It is noted that any number of sets of conductive traces may be implemented in accordance with the present embodiment. For example, operations described herein may be repeated as desired.

In one embodiment, sensor electrodes 106a-106n includes a clear conductive material. For example, in one instance, sensor electrodes 106a-106n are disposed by printing (e.g., screen printing) a conductive polymer in a desired conductive pattern. In one embodiment, such a polymer is clear in coloration. In another embodiment, sensor electrodes 106a-106n are disposed through patterning a conductive material such as ITO (indium tin oxide) on a thermoplastic polymer substrate such as a PET (polyethylene terephthalate) substrate or glass. In some instances this conductive material (e.g., ITO) comprises a water clear conductive coating.

It is appreciated that sensor electrodes 106a-106n may comprise several layers of conductive and insulating materials. For example, sensor electrodes 106a-106n that supports two-dimensional sensing of objects may be built up from one or more ITO+PET layers. When two or more ITO+PET layers are used, they are laminated together, such as with optically clear adhesive. In some embodiments the ITO is disposed into capacitive sensor pattern 125 via a sputtering process.

In general, routing traces 108a-108n are utilized to electrically access and couple with sensor electrodes 106a-106n and are disposed contemporaneously with the disposition of sensor electrodes 106a-106n. Normally, routing traces 108a-108n are used for connecting sensor electrodes 106a-106n with electronic components, such as an ASIC configured for interpreting whether and/or where an object touches or comes into proximity with the sensing region (sensor electrodes 106a-106n) of capacitive sensor 109 of FIG. 1.

For example, conductive ink pads and/or traces may be incorporated into or proximate to routing traces 108a-108n. Such traces and/or pads may be disposed in one or more regions of sensor device 109. In one embodiment, conductive pads are used for coupling routing traces 108a-108n with controller 102. In addition, although sensor device 202 has been shown as being substantially planar, it may be formed into a non-planar shape such as a curved surface of an automotive dashboard or console panel or sensor device 202 may be disposed as a keypad on an electronic device or over a display, such as a liquid crystal display.

In a further embodiment, an insulating material is deposited above the set of conductive traces. It is noted that the insulating material may act as protection (e.g., from handling damage) for the set of conductive traces and also provide them electrical insulation from the outside world. As such, the deposition of the insulating material may be an optional and may be implemented in diverse ways. For example, a deposition of a dielectric layer (e.g., $SiO_2$, Spin-On-Glass, and the like) may be used as the insulating material. It is appreciated that the insulating material may include a substantially transparent insulating material or an opaque insulating material. Additionally, the insulating material may be deposited to cover the entire set of conductive traces or it may be deposited to cover one or more portions of the set of conductive traces.

In one embodiment, each of routing traces 108a-108n have a first material 208 having a first resistivity and a second material 210 having a second resistivity. Moreover, the first resistivity of the first material 208 is different than the resistivity of the second material 210. In one embodiment, first material 208 and second material 210 may be materials such as conductive ink and indium tin oxide (ITO). In another embodiment, less than every trace 108a-108n includes the two materials. Sensor device 202 also includes a plurality of sensor electrodes such as sensor electrode 106a made of a plurality of sensor elements. In yet another embodiment, each of routing traces 108a-108n may be formed of a single material or a compound having different shapes and/or thicknesses to provide a first resistance region and a second resistance region. In so doing, that is, by incorporating materials with different resistivity, or differing resistance regions, into each of the plurality of traces, the resultant impedance mismatch will allow each of routing traces 108a-108/nto act as RF reflectors. Further, the impedance mismatch will reduce routing traces 108a-108n antenna efficiencies thereby resulting in reduced interference properties.

In one embodiment, described in detail herein, a capacitance of routing trace 108a is approximately equal to the capacitance of routing trace 108n. This is accomplished, in one embodiment, by controlling the amount of first material 208 and second material 210 used when forming each routing trace. In another embodiment, also described further herein, an RC time constant associated with the first routing trace 108a is approximately equal to the RC time constant associated with the second routing trace 108n. This may also be accomplished, in one embodiment, by controlling the amount of first material 208 and second material 210 used when forming each routing trace. For example, in one embodiment, the first material 208 and second material 210 may be disposed in sequence, interspersed, overlaid, or otherwise distributed in routing traces 108a-108n.

Moreover, although second material 210 is shown in a similar location, it is understood that second material 210 may be found in any location throughout routing traces 108a-108n. In addition, it is also understood that routing traces 108a-108n may have more than one portion formed of second material 210. Moreover, each of routing traces 108a-108n may be formed with different amounts, combinations, or patterns of first material 208 and second material 210. For example, a longer routing trace 108a may be formed with a different amount and/or shape of first material 208 and second material 210 than a shorter routing trace 108n.

Figure 3:
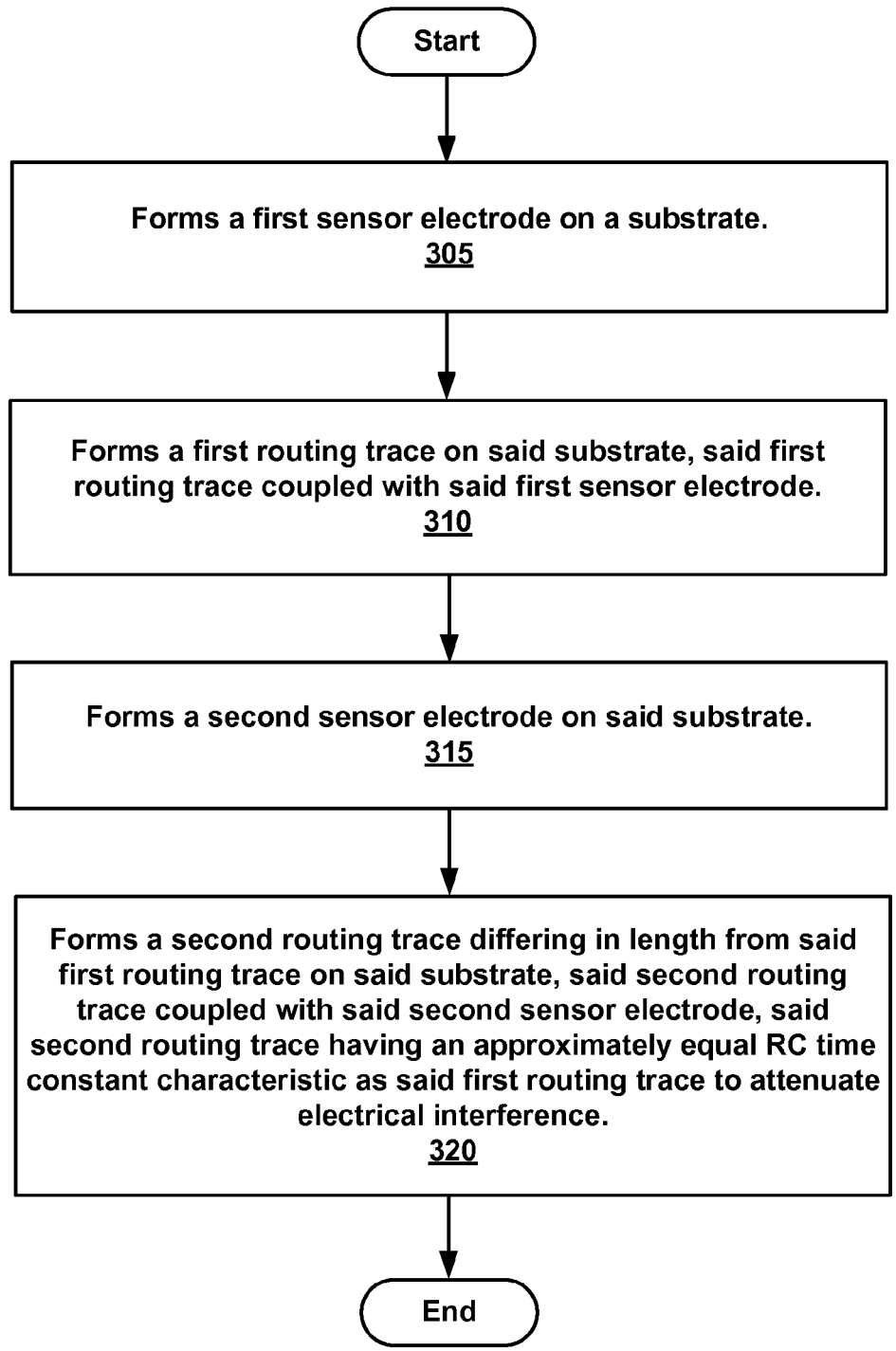
FIG. 3 is a flow diagram of a method for forming a capacitive sensing apparatus with attenuated electrical interference across a plurality of routing traces in accordance with an embodiment of the present technology.

With reference now to FIG. 3, a flow diagram of a method for forming a capacitive sensing apparatus with attenuated electrical interference across a plurality of routing traces in accordance with an embodiment of the present technology.

For example, in one embodiment, a substantially transparent substrate (e.g., a glass, a plastic or a crystalline material) is utilized to fabricate the capacitive sensing device. A set of conductive traces is patterned above the substantially transparent substrate. Optionally, an insulating material may be deposited above the set of conductive traces. In one embodiment, the insulating material may act as protection for the set of conductive traces and also provide them electrical insulation from the outside world.

With reference now to 305 of FIG. 3 and to FIG. 2, one embodiment forms a first sensor electrode 106a on a substrate 204. In one embodiment, substrate 204 is a substantially transparent substrate. For example, the substantially transparent substrate may include, but is not limited to, a glass, a plastic or a crystalline material. Additionally, the substantially transparent substrate may be a component of an information display device. For example, the substantially transparent substrate may be implemented as a part of a casing or front cover of the information display device. It is noted that the substantially transparent substrate may include a wide variety of materials in accordance with the present embodiment. In another embodiment, the substrate is not substantially transparent and may include, but is not limited to, silicon wafer, or the like.

First sensor electrode 106a is normally formed from a plurality of sensor elements patterned above the substrate. The forming or patterning of first sensor electrode 106a may be implemented in diverse ways. For example, the patterning of first sensor electrode 106a can include, but is not limited to, a lithographic process, a printing process, electron beam lithography, screen printing, inkjet printing, offset printing, electroplating, stamping, and LIGA. It is noted that LIGA is the German abbreviation for LIthogafie Galvanoformung Abformung which in English means lithographic electrodeposition.

First sensor electrode 106a can include substantially opaque material and/or substantially non-reflective material. Furthermore, first sensor electrode 106a may be formed of at least one layer of material that is substantially non-reflective. It is noted that by locating a substantially opaque, non-reflective material such that it faces a user of the capacitive sensing device, it can optically obscure from the user any reflective materials included as part of the set of conductive traces that make up first sensor electrode 106a. In this manner, the substantially non-reflective material makes the set of conductive traces more difficult to see by the user. It is noted that first sensor electrode 106a can include at least one layer of substantially opaque material.

Moreover, first sensor electrode 106a may be patterned such that each of the conductive traces has a width less than approximately 12 micrometers. It is noted that the width of each conductive trace may be understood to mean the width of each individual conductive element of the set of conductive traces forming first sensor electrode 106a. In this manner, when a user is approximately at arm's length from the capacitive sensing device, the user's eyes are substantially unable to view the set of conductive traces of the capacitive sensing device. It is understood that by decreasing the width of each trace of the set of conductive traces, there is a point at which they are no longer resolvable by a human eye. In this fashion, there is no deleterious obstruction of an underlying image by the set of conductive traces that make up first sensor electrode 106a.

With reference now to 310 of FIG. 3 and to FIG. 2, one embodiment forms a first routing trace 108a on the substrate 204. The first routing trace 108a coupled with the first senor electrode 106a. In general, first routing trace 108a may be formed in diverse ways. For example, first routing trace 108a may be formed from a first material 208 having a first resistivity and a second material 210 having a second resistivity. For example, first material 208 may be a conductive ink such as silver ink while second material 210 may be ITO. However, it is also appreciated that first routing trace 108a may be formed from a single material or compound having thicker local portions or wider local portions to produce lower resistance portions such as described and shown with respect to first material 208 and second material 210.

Furthermore, the patterning of first routing trace 108a can include patterning a landing pad region above substrate 204 to enable coupling of one or more sensing circuit components, such as controller 102 of FIG. 2, to substrate 204. For example, the landing pad region may include wiring for coupling integrated circuit (IC) chips, capacitors, resistors, connectors and other electronic components to the substantially transparent substrate. Additionally, to promote solderability, the landing pad region may be plated with gold, tin, copper or any other metal that is compatible with solder.

With reference now to 315 of FIG. 3 and to FIG. 2, one embodiment forms a second sensor electrode 106n on a substrate 204. Second sensor electrode 106n is normally formed from a plurality of sensor elements patterned above the substrate. The forming or patterning of second sensor electrode 106n may be implemented in diverse ways. For example, the patterning of second sensor electrode 106n can include, but is not limited to, a lithographic process, a printing process, electron beam lithography, screen printing, inkjet printing, offset printing, electroplating, stamping, and LIGA. It is noted that LIGA is the German abbreviation for LIthogafie Galvanoformung Abformung which in English means lithographic electrodeposition.

Second sensor electrode 106n can include substantially opaque material and/or substantially non-reflective material. Furthermore, the set of conductive traces may be formed of at least one layer of material that is substantially non-reflective. It is noted that by locating a substantially opaque, non-reflective material such that it faces a user of the capacitive sensing device, it can optically obscure from the user any reflective materials included as part of the set of conductive traces. In this manner, the substantially non-reflective material makes the set of conductive traces more difficult to see by the user. It is noted that the set of conductive traces can include at least one layer of substantially opaque material.

In another embodiment, second sensor electrode 106n may be patterned such that each of the conductive traces has a width less than approximately 12 micrometers. It is noted that the width of each conductive trace may be understood to mean the width of each individual conductive element of the set of conductive traces forming second sensor electrode 106n. In this manner, when a user is approximately at arm's length from the capacitive sensing device, the user's eyes are substantially unable to view the set of conductive traces that make up second sensor electrode 106n. It is understood that by decreasing the width of each trace of the set of conductive traces, there is a point at which they are no longer resolvable by a human eye. In this fashion, there is no deleterious obstruction of an underlying image by the set of conductive traces of the second sensor electrode 106n.

With reference now to 320 of FIG. 3 and to FIG. 2, one embodiment forms a second routing trace 108n differing in length from the first routing trace 108a on the substrate 204. The second routing trace 108n coupled with the second senor electrode 106n.

In general, second routing trace 108n may be formed in diverse ways. For example, second routing trace 108n may be formed from a first material 208 having a first resistivity and a second material 210 having a second resistivity. For example, first material 208 may be a conductive ink such as silver ink while second material 210 may be ITO. However, it is also appreciated that first routing trace 108a may be formed from a single material or compound having thicker local portions or wider local portions to produce lower resistance portions such as described and shown with respect to first material 208 and second material 210.

Furthermore, the patterning of first routing trace 108a can include patterning a landing pad region above substrate 204 to enable coupling of one or more sensing circuit components, such as controller 102 of FIG. 2, to substrate 204. For example, the landing pad region may include wiring for coupling integrated circuit (IC) chips, capacitors, resistors, connectors and other electronic components to the substantially transparent substrate. Additionally, to promote solderability, the landing pad region may be plated with gold, tin, copper or any other metal that is compatible with solder.

In one embodiment, second routing trace 108n has an RC time constant that is approximately equal to the RC time constant of the first routing trace 108a to attenuate electrical interference. For example, second material 210 may be overlaid or interspersed with respect to first material 208. Thus, as described herein, by incorporating materials with different resistivity into each of the plurality of traces, or by modifying the shape of a single material to produce sections of the routing trace having different resistance values, the resultant impedance mismatch will allow each of the routing traces 108a-108n to act as a radio frequency (RF) reflector. Further, the impedance mismatch will reduce trace antenna efficiencies thereby resulting in reduced interference properties at routing traces 108a-108n. For example, small resistivity changes in routing traces 108a-108n will significantly reduce the RF coupling efficiency. In other words, the impedance mismatch will deter routing traces 108a-108n from acting as antenna when RF or other low frequency interference is encountered; such as when a sensor device is used in mobile phone applications, LCD applications, or the like.

In a further embodiment, the resistance of routing traces 108a-108n may be varied such that an overall matching RC time constant is realized for each of routing traces 108a-108n. In other words, by balancing the RC time constant across two or more routing traces 108a-108n, common mode interference will be received at the controller 102 as common mode noise and will result in a capacitive sensing device with significantly better balanced common mode RF interference recognition and removal.

Thus, when a sensing frequency is varied each of routing traces 108a-108n will be affected similarly; that is, in a common mode fashion. As such, embodiments described herein provide a cost effective method of adding this resistance to routing traces 108a-108n. Moreover, since the sensor device controller firmware is presently designed to cope with common mode disturbances, the technology described herein will enable variable sensing frequencies, reduce clock modulation related jitter, and the like while adding little or no present or follow-on programming overhead to controller 102. Additionally, embodiments described herein may also be utilized for RC sheet sensors.

In one embodiment, portions of the present technology are composed of computer-readable and computer-executable instructions that reside, for example, in computer-usable media of a computer system. That is, pluralities of computer systems and components having computer readable media disposed thereon (e.g. random access memory (RAM) and/or read-only memory (ROM)) may be used to implement embodiments, of the present technology. Moreover, embodiments described herein can operate on or within a number of different computer systems including general purpose networked computer systems, embedded computer systems, routers, switches, server devices, client devices, various intermediate devices/nodes, stand alone computer systems, and the like.

The foregoing descriptions of specific embodiments have been presented for purposes of illustration and description. They are not intended to be exhaustive or to limit the presented technology to the precise forms disclosed, and obviously many modifications and variations are possible in light of the above teaching. The embodiments were chosen and described in order to best explain the principles of the presented technology and its practical application, to thereby enable others skilled in the art to best utilize the presented technology and various embodiments with various modifications as are suited to the particular use contemplated. It is intended that the scope of the present technology be defined by the claims appended hereto and their equivalents.

What is claimed is:

1. A capacitive sensing apparatus having reduced electrical interference, said capacitive sensing apparatus comprising:
    a first material having a resistivity;
    a second material having a resistivity different from said resistivity of said first material;
    a first routing trace comprised of said first material and said second material, said first routing trace having a length and a resistance to reduce electrical interference; and
    a second routing trace comprised of said first material and said second material, said second routing trace having a length different from said length of said first trace and a resistance to reduce electrical interference.

2. The capacitive sensing apparatus of claim 1 further comprising:
    a plurality of sensor electrodes disposed on a substrate, wherein said first routing trace is coupled with a first sensor electrode and said second routing trace is coupled with a second sensor electrode.

3. The capacitive sensing apparatus of claim 1 wherein a capacitance of said first routing trace is approximately equal to a capacitance of said second routing trace.

4. The capacitive sensing apparatus of claim 1 wherein an RC time constant associated with said first routing trace is approximately equal to an RC time constant associated with said second routing trace.

5. The capacitive sensing apparatus of claim 1 wherein each of said first material and said second material is selected from the group of materials consisting of: conductive ink and indium tin oxide (ITO).

6. The capacitive sensing apparatus of claim 1 wherein said second material is overlaid with respect to said first material in at least one of said first routing trace and said second routing trace.

7. The capacitive sensing apparatus of claim 1 wherein said second material is disposed in sequence with said first material in at least one of said first routing trace and said second routing trace.

8. A common mode noise attenuating capacitive sensing apparatus comprising:
    a substrate;
    a first substantially transparent sensor electrode disposed on said substrate;
    a first routing trace electrically coupled with said first substantially transparent sensor electrode, said first routing trace comprising a first material and a second material, said first routing trace having a length and an RC time constant;

a second substantially transparent sensor electrode disposed on said substrate; and a second routing trace electrically coupled with said second substantially transparent sensor electrode, said second routing trace having a length different from said length of said first routing trace and an RC time constant approximately equal to said RC time constant of said first routing trace, said first and said second routing traces configured for attenuating common mode noise with respect to said capacitive sensing apparatus.

9. The capacitive sensing apparatus of claim 8 wherein said first material is selected from the group of materials consisting of: silver ink, carbon ink, and indium tin oxide (ITO).

10. The capacitive sensing apparatus of claim 8 wherein said second material is layered with respect to said first material in at least one of said first routing trace and said second routing trace.

11. The capacitive sensing apparatus of claim 8 wherein said second material is interspersed with said first material in at least one of said first routing trace and said second routing trace.

12. The capacitive sensing apparatus of claim 8 wherein said first material has a resistivity and said second material has a resistivity different from said resistivity of said first material.

13. The capacitive sensing apparatus of claim 8 wherein said first routing trace comprises one of a locally thicker portion and a locally wider portion to produce a lower resistance portion.

14. A method for making a capacitive sensing apparatus with attenuated electrical interference across a plurality of routing traces, said method comprising:

forming a first sensor electrode on a substrate;

forming a first routing trace on said substrate, said first routing trace coupled with said first sensor electrode;

forming a second sensor electrode on said substrate; and forming a second routing trace differing in length from said first routing trace on said substrate, said second routing trace coupled with said second sensor electrode, said second routing trace having an approximately equal RC time constant characteristic as said first routing trace to attenuate electrical interference.

15. The method of claim 14 wherein forming said first routing trace comprises:

forming said first routing trace with one of a thicker local portion and a wider local portion to produce a lower resistance portion.

16. The method of claim 14 wherein forming said first routing trace comprises:

patterning a first material to form a first part of said first routing trace; and patterning a second material to form a second part of said first routing trace.

17. The method of claim 16 wherein patterning said second material to form said second part of said first routing trace comprises:

overlaying said second material with respect to said first material.

18. The method of claim 16 wherein patterning said second material to form said second part of said first routing trace comprises:

interspersing said second material with said first material.

19. The method of claim 14 wherein forming said first routing trace comprises:

patterning a first part of said first routing trace using a first material; and patterning a second part of said first routing trace using a second material different from said first material, wherein said second material is also used in forming said first sensor electrode.

20. The method of claim 19 wherein said second material is substantially transparent.

* * * * *